United States Patent [19]
Sekiya et al.

[11] Patent Number: 6,026,036
[45] Date of Patent: Feb. 15, 2000

[54] SYNCHRONOUS SEMICONDUCTOR MEMORY DEVICE HAVING SET UP TIME OF EXTERNAL ADDRESS SIGNAL REDUCED

[75] Inventors: Takashi Sekiya; Tomohisa Wada; Kunihiko Kozaru, all of Hyogo, Japan

[73] Assignee: Mitsubishi Denki Kabushiki Kaisha, Tokyo, Japan

[21] Appl. No.: 09/212,308

[22] Filed: Dec. 16, 1998

[30] Foreign Application Priority Data

Jul. 13, 1998 [JP] Japan ................................. 10-197625

[51] Int. Cl.⁷ ................................. G11C 7/00; G11C 8/00
[52] U.S. Cl. ...................... 365/200; 365/230.08; 365/233
[58] Field of Search ............................... 365/200, 230.08, 365/233, 189.05, 230.06

[56] References Cited

U.S. PATENT DOCUMENTS

| | | | |
|---|---|---|---|
| 5,086,414 | 2/1992 | Nambu et al. | 365/230.08 |
| 5,687,125 | 11/1997 | Kikuchi | 365/200 |
| 5,841,711 | 11/1998 | Watanabe | 365/200 |
| 5,862,097 | 1/1999 | Toda | 365/200 X |
| 5,930,183 | 7/1999 | Kojima et al. | 365/200 |

*Primary Examiner*—Do Hyun Yoo
*Attorney, Agent, or Firm*—McDermott, Will & Emery

[57] ABSTRACT

In a synchronous semiconductor memory device, a predecoder is provided between a former stage address input register formed of first latch circuits and a latter stage address input register formed of second latch circuits. The first and second latch circuits operate in response to first and second internal clock signals complementary to each other. A predecode signal can be latched by the second latch circuit even when the generation of the predecode signal is not in time for the rise of the second internal dock signal due to delay of the input of an external address signal. Accordingly, the set up time for the external address signal can be reduced.

7 Claims, 8 Drawing Sheets

SYNCHRONOUS SEMICONDUCTOR MEMORY DEVICE HAVING SET UP TIME OF EXTERNAL ADDRESS SIGNAL REDUCED

BACKGROUND OF THE INVENTION

1. Field of the Invention

The present invention relates to synchronous semiconductor memory devices, and more particularly, to a synchronous burst static random access memory (abbreviated as "BSRAM" hereinafter) including an address input register.

2. Description of the Background Art

In these few years, it is common to arrange a cache memory between a microprocessor and the main memory to increase the speed of the computer system. A BSRAM operating in synchronization with an external clock signal is widely used as a cache memory.

FIG. 8 is a block diagram schematically showing a conventional BSRAM. Referring to FIG. 8, this BSRAM 1 includes a memory cell array 2, a clock buffer 3, an address buffer 4, a predecoder 5, an address input register 6, a decoder 7, and an input/output (I/O) buffer 8. For the sake of simplification, only the circuits related to the 2 bits of external address signals EA0 and EA1 are shown in FIG. 8, representative thereof. In practice, many more bits of external address signals are applied.

FIG. 9 is a timing chart showing an operation of the BSRAM of FIG. 8. Referring to FIG. 9, clock buffer 3 generates complementary internal clock signals φ1 and φ2 in response to an external clock signal CLK. External address signals EA0 and EA1 are applied during an H (logical high) level of internal clock signal φ1. Address buffer 4 generates complementary internal address signals A0, A1 and /A0, /A1 in response to external address signals EA0 and EA1. Here, there is a delay time D1 from the input of external address signals A0 up to the generation of internal address signal /A0. Then, predecoder 5 generates predecode signals /A1•/A0, /A1•A0, A1•/A0, A1•A0 in response to internal address signals A0, /A0, A1, /A1. Here, there is a delay time D2 from the generation of internal address signal /A0 up to generation of predecode signals /A1•/A0. Since internal clock signal φ1 is now at an H level, predecode signals /A1•/A0, /A1•A0, A1•/A0, A1•A0 are latched in latch circuits 61–64 located as the former stage of address input register 6. In response to a rise of internal clock signal φ2, predecode signals /A1•/A0, /A1•A0, A1•/A0, A1•A0 latched in latch circuits 61–64 are latched at the latter stage of latch circuits 65–68, respectively. Address input register 6 provides these latched predecode signals /A1•/A0, /A1•A0, A1•/A0, A1•A0 to decoder 7.

In order to reliably latch predecode signals /A1•/A0 in latch circuit 65, the latch of predecode signals /A1•/A0 by latch circuit 61 must be completed before internal clock signal φ2 is pulled up. More specifically, a set up time tsu (reg) of address input register 6 is required from the generation of predecode signals /A1•/A0 up to the rise of internal clock signal φ2. This means that the total of the above delay times D1 and D2 and the set up time tsu (reg) of address input register 6 is at least required for the set up time ts of external address signal A0. More specifically, ts≧D1+D2+tsu (reg).

When the input of external address signals EA0 and EA1 is delayed so that the time starting from the input of external address signals EA0 and EA1 up to the rise of internal clock signal φ2 becomes shorter than set up time ts, latch circuits 65–68 will not be able to latch predecode signals /A1•/A0, /A1•A0, A1•/A0, A1•A0. As a result, address input register 6 will not be able to output the proper signals.

A redundancy circuit that substitutes a defective memory cell with a spare memory cell is provided to improve the yield in a RAM. The above-described set up time is also required for such a redundancy circuit. There is a problem that the redundancy circuit will not operate properly if the input of an external address signal is delayed.

U.S. Pat. No. 5,086,414 disclosing a memory including two stages of latch circuit is completely silent about the redundancy circuit.

SUMMARY OF THE INVENTION

In view of the foregoing, an object of the present invention is to provide a synchronous semiconductor memory device having a short set up time for an external address signal.

According to an aspect of the present invention, a synchronous semiconductor memory device operating in synchronization with an external clock signal includes a memory cell array, a redundant memory cell array, a clock buffer, a first latch circuit, a predecoder, a second latch circuit, a decoder, a program circuit, a third latch circuit, and a redundancy decoder. The clock buffer generates first and second internal clock signals complementary to each other in response to an external clock signal. The first latch circuit latches an address signal in response to the first internal clock signal. The predecoder generates a predecode signal in response to the address signal from the first latch circuit. The second latch circuit latches the predecode signal from the predecoder in response to the second internal clock signal. The decoder accesses the memory cell array in response to the predecode signal from the second latch circuit. The program circuit is programmable of a defective address, and generates an enable signal when the address signal from the first latch circuit designates a programmed defective address. The third latch circuit latches the enable signal in response to the second internal clock signal. The redundancy decoder accesses the redundant memory cell array in response to the enable signal from the third latch circuit.

In the above synchronous semiconductor memory device, the predecode signal is latched by the second latch circuit even when generation of the predecode signal is not in time for the rise or fall of a second internal clock signal due to delay of the external clock signal input. Thus, the set up time for an external address signal can be reduced.

Preferably, the synchronous semiconductor memory device further includes an address buffer. The address buffer responds to an external address signal to generate and provide to the first latch circuit first and second internal address signals complementary to each other. Alternatively, the synchronous semiconductor memory device further includes a first address buffer and a second address buffer. The first address buffer responds to an external address signal to generate and provide to the first latch circuit an internal address signal. The second address buffer responds to the internal address signal from the first latch circuit to generate and provide to the predecoder first and second internal address signals complementary to each other.

In this case, the required number of latch circuits can be reduced when the first latch circuit is provided within the address buffer than in the case where the first latch circuit is provided between the address buffer and the predecoder. Accordingly, the required layout area for the first latch circuit can be reduced.

Preferably, the first latch circuit includes a first switch and a first latch. The first switch is turned on in response to the first internal clock signal. The first latch latches the address signal applied via the first switch.

Preferably, the second latch circuit includes a second switch and a second latch. The second switch is turned on in response to the second internal clock signal. The second latch latches the address signal applied through the second latch.

According to another aspect of the present invention, a synchronous semiconductor memory device operating in synchronization with an external clock signal includes a memory cell array, a redundant memory cell array, a clock buffer, an address buffer, a plurality of first latch circuits, a predecoder, a plurality of second latch circuits, a decoder, a program circuit, a third latch circuit, and a redundancy decoder. The clock buffer generates first and second internal clock signals complementary to each other in response to an external clock signal. The address buffer includes a plurality of buffers and a complementary address generation unit. The plurality of buffers are provided corresponding to the bits of the external address signal. Each buffer receives a corresponding bit of the external address signal. The complementary address generation unit generates first and second internal address signals complementary to each other in response to the external address signal from the plurality of buffers. The plurality of first latch circuits are provided corresponding to the bits of the first and second internal address signals. Each latch circuit responds to the first internal clock signal to latch a corresponding bit of the first and second internal address signals. The predecoder generates a predecode signal in response to the first and second internal address signals from the plurality of first latch circuits. The plurality of second latch circuits are provided corresponding to the bits of the predecode signal. Each second latch circuit responds to the second internal clock signal to latch a corresponding bit of the predecode signal from the predecoder. The decoder responds to the predecode signal from the plurality of second latch circuits to access the memory cell array. The program circuit is programmable of a defective address, and generates an enable signal when the first and second internal address signals from the plurality of first latch circuits designate a programmed defective address. The third latch circuit responds to the second internal clock signal to latch the enable signal. The redundancy decoder responds to the enable signal from the third latch circuit to access the redundant memory cell array.

Since the first latch circuit is provided before the predecoder and after the address buffer in the above synchronous semiconductor memory device, the predecode signal is latched by the second latch circuit even when the generation of the predecode signal is not in time for the rise or fall of the second internal clock signal due to delay of the external address signal input. Therefore, the set up time for an external address signal can be reduced.

According to a further aspect of the present invention, a synchronous semiconductor memory device operating in synchronization with an external clock signal includes a memory cell array, a redundant memory cell array, a clock buffer, and an address buffer. The clock buffer generates first and second internal clock signals complementary to each other in response to an external clock signal. The address buffer includes a plurality of buffers, a plurality of first latch circuits, and a complementary address generation unit. The plurality of buffers are provided corresponding to the bits of the external address signal. Each buffer receives a corresponding bit of the external address signal. The plurality of first latch circuits are provided corresponding to the plurality of buffers. Each first latch circuit responds to the first internal clock signal to latch the bit of the external address signal from a corresponding buffer. The complementary address generation unit responds to the external address signal from the plurality of first latch circuits to generate first and second internal address signals complementary to each other. The synchronous semiconductor memory device further includes a predecoder, a plurality of second latch circuits, a decoder, a program circuit, a third latch circuit, and a redundancy decoder. The predecoder responds to the first and second internal address signals from the address buffer to generate a predecode signal. The plurality of second latch circuits are provided corresponding to the bits of the predecode signal. Each second latch circuit responds to the second internal clock signal to latch a corresponding bit of the predecode signal from the predecoder. The decoder responds to the predecode signal from the plurality of second latch circuits to access the memory cell array. The program circuit is programmable of a defective address, and generates an enable signal when the external address signal from the plurality of first latch circuits designates a programmed defective address. The third latch circuit responds to the second internal clock signal to latch the enable signal. The redundancy decoder responds to the enable signal from the third latch circuit to access the redundant memory cell array.

Since the first latch circuit is provided within the address buffer in the above synchronous semiconductor memory device, the predecode signal is latched by the second latch circuit even when the generation of the predecode signal is not in time for the rise or fall of the second internal clock signal due to delay in the external address signal input. Therefore, the set up time for the external address signal can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
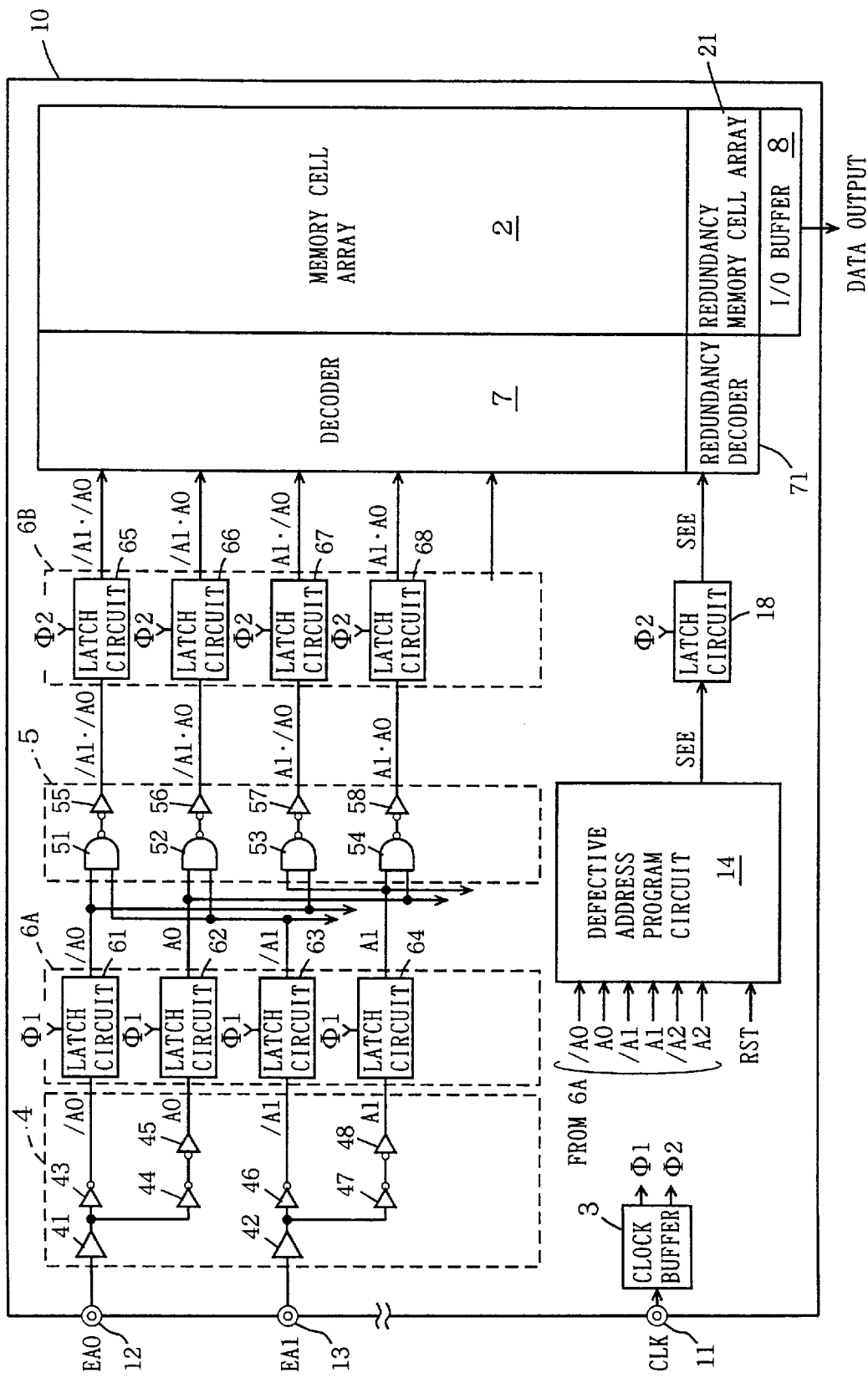
FIG. 1 is a block diagram showing a schematic structure of a BSRAM according to a first embodiment of the present invention.

Embodiments of the present invention will be described hereinafter with reference to the drawings. In the drawings, the same or corresponding components have the same reference characters allotted, and their description will not be repeated.

First Embodiment

Referring to FIG. 1, a BSRAM 10 according to a first embodiment of the present invention includes a memory cell array 2, a redundancy memory cell array 21, a clock buffer 3, an address buffer 4, a former stage address input register 6A, a predecoder 5, a latter stage address input register 6B, a decoder 7, a defective address program circuit 14, a latch circuit 18, a redundancy decoder 71, and an input/output buffer 8.

Memory cell array 2 includes a plurality of static memory cells (not shown) arranged in a plurality of rows and a plurality of columns, a plurality of word lines (not shown) arranged in the plurality of rows, each word line being connected to a plurality of memory cells arranged in a corresponding row, and a plurality of bit line pairs (not shown) arranged in the plurality of columns, each bit line pair being connected to a plurality of memory cells arranged in a corresponding column. Redundant memory cell array 21 includes a plurality of redundant static memory cells (not shown). A redundant static memory cell can be electrically replaced for a defective static memory cell in a memory cell array 2. The address of a defective static memory cell in the memory cell array is referred to as "defective address" in the present specification.

Figure 2:
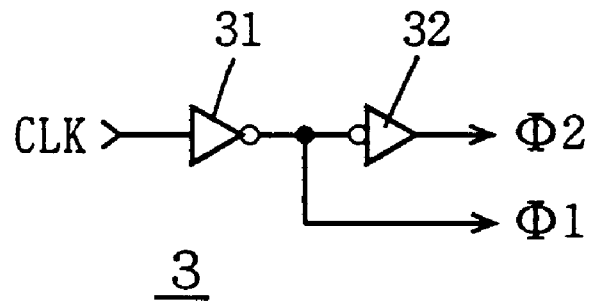
FIG. 2 is a circuit diagram showing a structure of the clock buffer of FIG. 1.

Clock buffer 3 includes inverter circuits 31 and 32 shown in FIG. 2. Clock buffer 3 responds to an external dock signal CLK applied via a dock terminal 11 to generate internal clock signals $\phi 1$ and $\phi 2$ complementary to each other.

Address buffer 4 includes buffers 41 and 42, and inverter circuits 43–48. Buffers 41 and 42 are provided corresponding to bits EA0 and EA1, respectively, of an external address signal. The first bit EA0 of the external address signal is applied to buffer 41 via an address terminal 12. The second bit EA1 of the external address signal is applied to buffer 42 via an address terminal 13. It is to be noted that only the circuits related to the first and second bits EA0 and EA1 of the external address signals are illustrated representative thereof in FIG. 1. Inverter circuits 43–48 respond to external address signals EA0 and EA1 from buffers 41 and 42 to generate first external address signals A0, A1 and second external address signals /A0, /A1 complementary to each other.

Former stage address input register 6A includes a plurality of latch circuits 61–64. Latch circuits 61–64 are provided corresponding to bits /A0, A0, /A1, A1 of the internal address signal. Each of latch circuits 61–64 responds to internal clock signal $\phi 1$ to latch a corresponding bit of the internal address signal.

Figure 3:
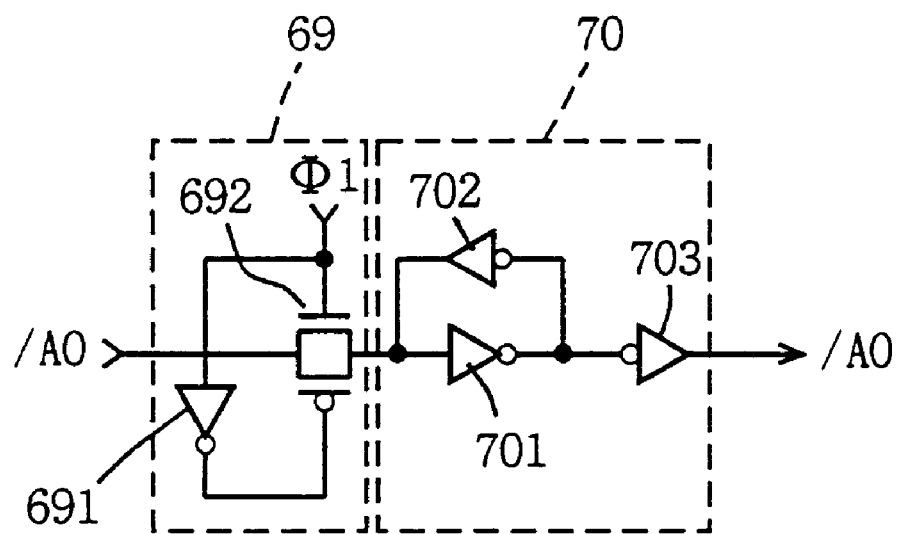
FIG. 3 is a circuit diagram showing a structure of the latch circuit of FIG. 1.

Latch circuit 61 includes a switch 69 and a latch 70 as shown, for example, in FIG. 3. Switch 69 includes an inverter circuit 691 and a transfer gate 692. Transfer gate 692 is turned on in response to internal clock signal $\phi 1$. Latch 70 includes inverter circuits 701–703. Latch 70 latches a corresponding bit /A0 of the address signal applied through latch 69. Therefore, latch circuit 61 latches a corresponding bit /A0 of the internal address signal in response to internal clock signal $\phi 1$. The remaining latch circuits 62–64 have a structure similar to that of latch circuit 61.

Referring to FIG. 1 again, predecoder 5 includes NAND circuits 51–54, and inverter circuits 55–58. Therefore, predecoder 5 responds to internal address signals /A0, A0, /A1, A1 from former stage address input register 6A to generate predecode signals /A1•/A0, /A1•A0, A1•/A0, A1•A0.

Latter stage address input register 6B includes a plurality of latch circuits 65–68. Latch circuits 65–68 are provided corresponding to bits /A1•/A0, /A1•A0, A1•/A0, A1•A0 of the predecode signal, respectively. Each of latch circuits 65–68 responds to internal clock signal $\phi 2$ to latch a corresponding bit of the predecode signals /A1•/A0, /A1•A0, A1•/A0, A1•A0 from predecoder 5. Latch circuits 65–68 have a structure similar to that of latch circuit 61 of FIG. 3.

Decoder 7 responds to predecode signals /A1•/A0, /A1•A0, A1•/A0, A1•A0 from latter stage address input register 6B to access memory cell array 2. More specifically, decoder 7 includes a row decoder (not shown) selecting a word line in memory cell array 2, and a column decoder (not shown) selecting a bit line pair in memory cell array 2.

Defective address program circuit 14 is programmable of a defective address and generates a spare element enable signal SEE when internal address signals /A0, A0, /A1, A1 from former stage address input register 6A designate a programmed defective address. The details of defective address program circuit 14 will be described afterwards.

Latch circuit 18 responds to internal clock signal $\phi 2$ to latch spare element enable signal SEE. Latch circuit 18 has a structure similar to that of latch circuit 61 of FIG. 3.

Redundancy decoder 71 responds to spare element enable signal SEE from latch circuit 18 to access redundancy memory cell array 21. More specifically, redundancy decoder 71 substitutes the defective portion in memory cell array 2 with redundant memory cell array 21.

Input/output buffer 8 outputs the data read out from memory cell array 2 or redundant memory cell array 21, and writes externally applied data into memory cell array 2 or redundancy memory cell array 21.

Figure 4:
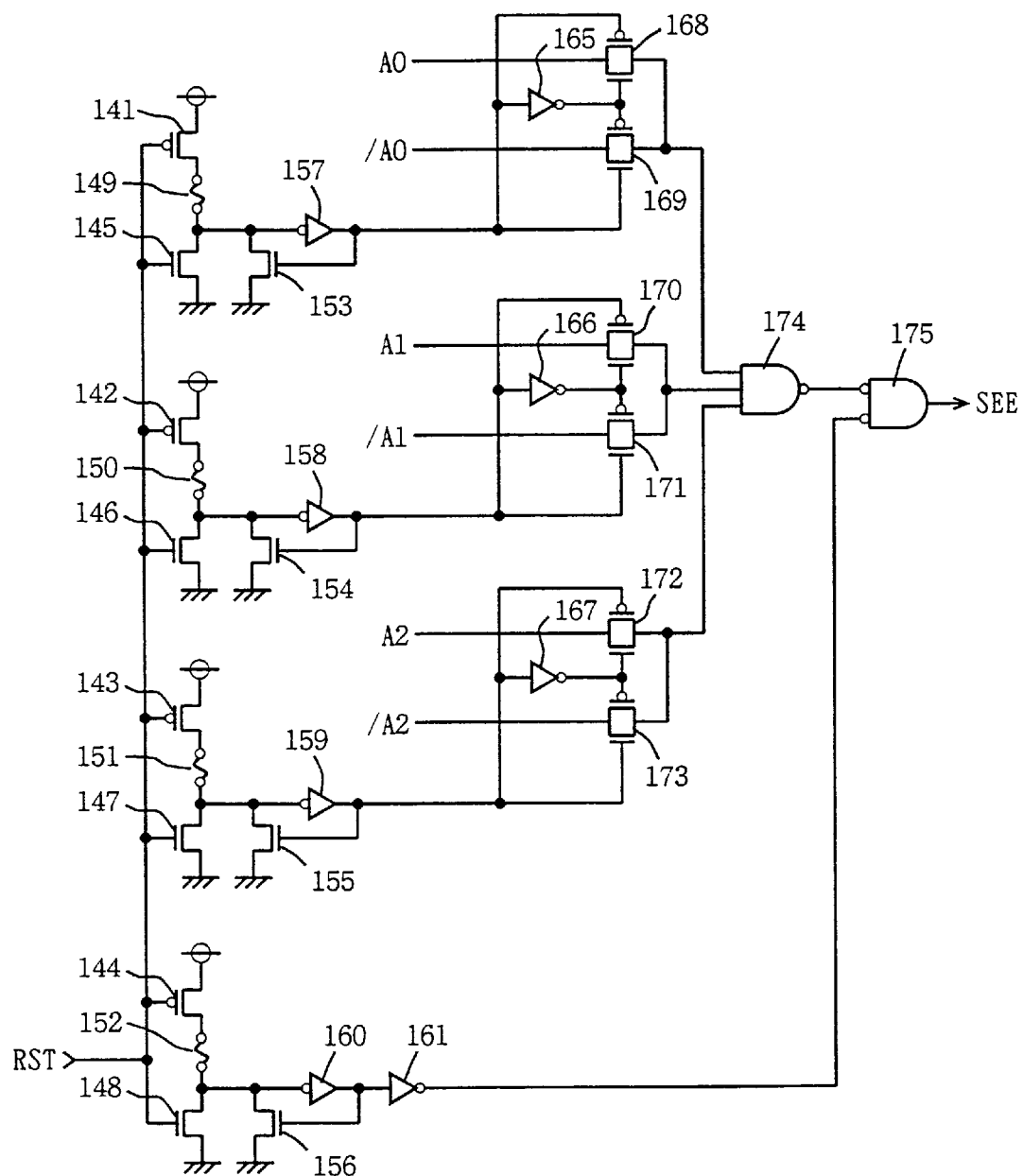
FIG. 4 is a circuit diagram showing a structure of the defective address program circuit of FIG. 1.

As shown in FIG. 4, defective address program circuit 14 includes P channel MOS transistors 141–144, N channel MOS transistors 145–148, fuses 149–152, N channel MOS transistors 153–156, and inverter circuits 157–161. Defective address program circuit 14 receives a reset signal RST that is at an H level for only a predetermined time right after power is turned on. Reset signal RST is applied to the gates of transistors 141–148.

Defective address program circuit 14 further includes inverter circuits 165–167, transfer gates 168–173, a NAND circuit 174, and a NOR circuit (negative logic) 175. Internal address signals A0, /A0, A1, /A1, A2, /A2 from former stage address input register 6A are applied to NAND circuit 174 via transfer gates 168–173. NOR circuit 175 responds to the output signals from NAND circuit 174 and from inverter circuit 161 to generate a spare element enable signal SEE. In FIG. 4, only the circuits related to internal address signals A0, /A0, A1, /A1, A2, /A2 are illustrated representative thereof.

When there is no defect in memory cell array 2, i.e., when the redundancy circuit such as redundant memory cell array 21 and redundancy decoder 71 is not used, none of fuses 149–152 is blown out. Therefore, reset signal RST attains an L (logical low) level at an elapse of a sufficient time from power on. In response, inverter circuit 161 provides an output signal of an H level to NOR circuit 175. Therefore, NOR circuit 175 renders spare element enable signal SEE to an inactive state of an L level irrespective of the output signal of NAND circuit 174.

When there is a defect in memory cell array 2, i.e., when the redundancy circuit is used, fuse 152 is disconnected and any of fuses 149–151 is blown out to program the defective address. Therefore, when reset signal RST attains an H level right after the power is turned on, the inverter circuit formed of transistors 144 and 148 provides an output signal of an L level to inverter circuit 160. The latch circuit formed of inverter circuit 160 and transistor 156 latches this output signal. Subsequently, reset signal RST is pulled down to an L level. However, the latch circuit formed of inverter 160 and transistor 156 maintains the output signal at the H level since fuse 152 is blown out. Therefore, inverter circuit 161 maintains the output signal at an L level.

For example, when (A0, A1, A2)=(0, 1 ,0) is defective, fuses 149 and 151 are blown out. Fuse 150 is not blown out. At an elapse of a predetermined time from power on, the latch circuit formed of inverter circuit 157 and transistor 153 and the latch circuit formed of inverter circuit 159 and transistor 155 maintain respective output signals at the H level as in the above case. However, the latch circuit formed of inverter circuit 158 and transistor 154 has its output signal driven to an L level. In response, transfer gates 169, 170 and 173 are turned on, whereas transfer gates 168, 171 and 172 are turned off. As a result, internal address signals /A0, A1, /A2 are applied to NAND circuit 174. Thus, in the case of (A0, A1, A2)=(0, 1 ,0), all the three input signals of NAND circuit 174 attain an H level, whereby an output signal of an L level is applied to NOR circuit 175. In response, NOR circuit 175 renders spare element enable signal SEE to an active state of an H level.

Figure 8:
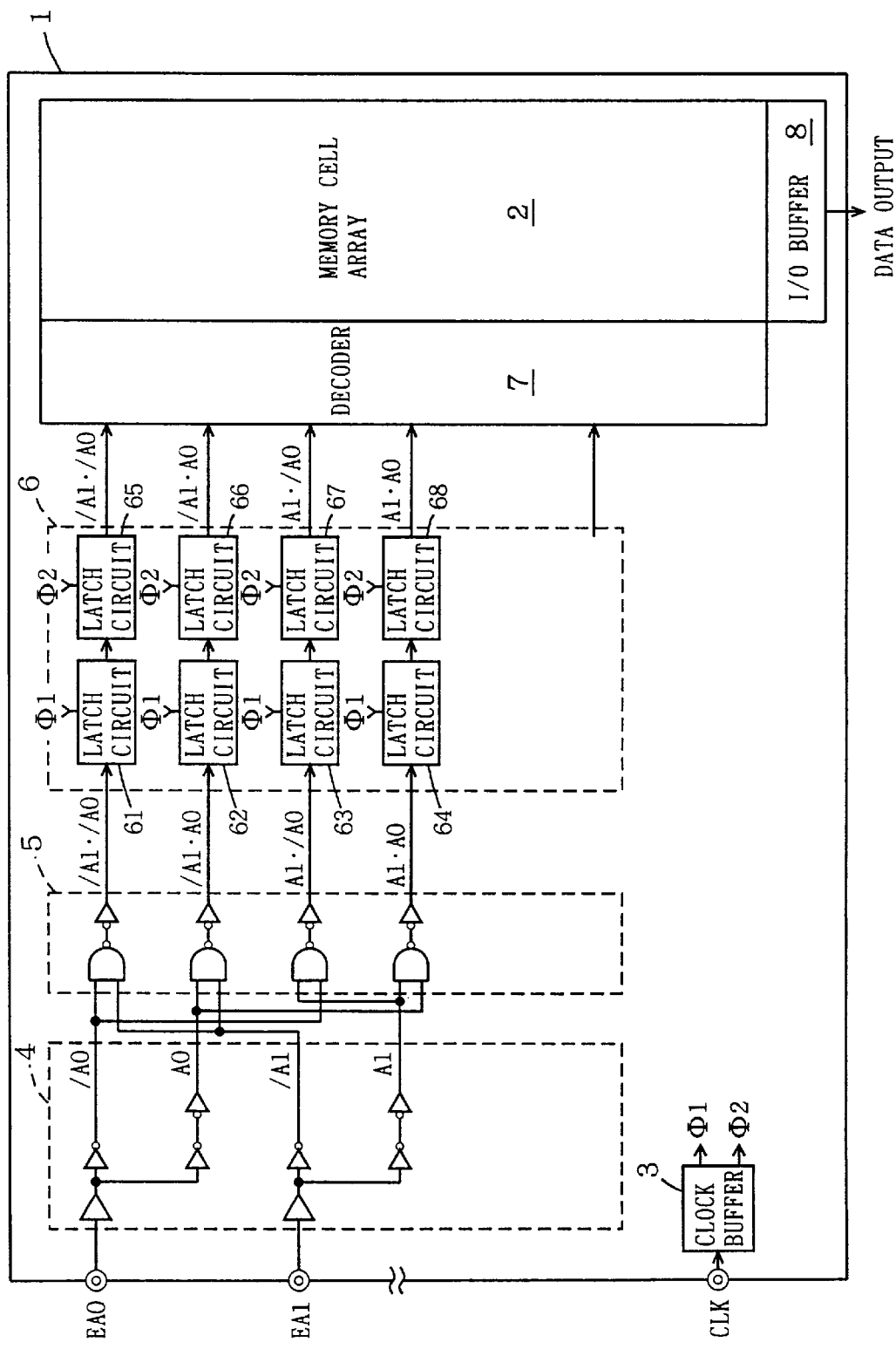
FIG. 8 is a block diagram showing a schematic structure of a conventional BSRAM.
Figure 9:
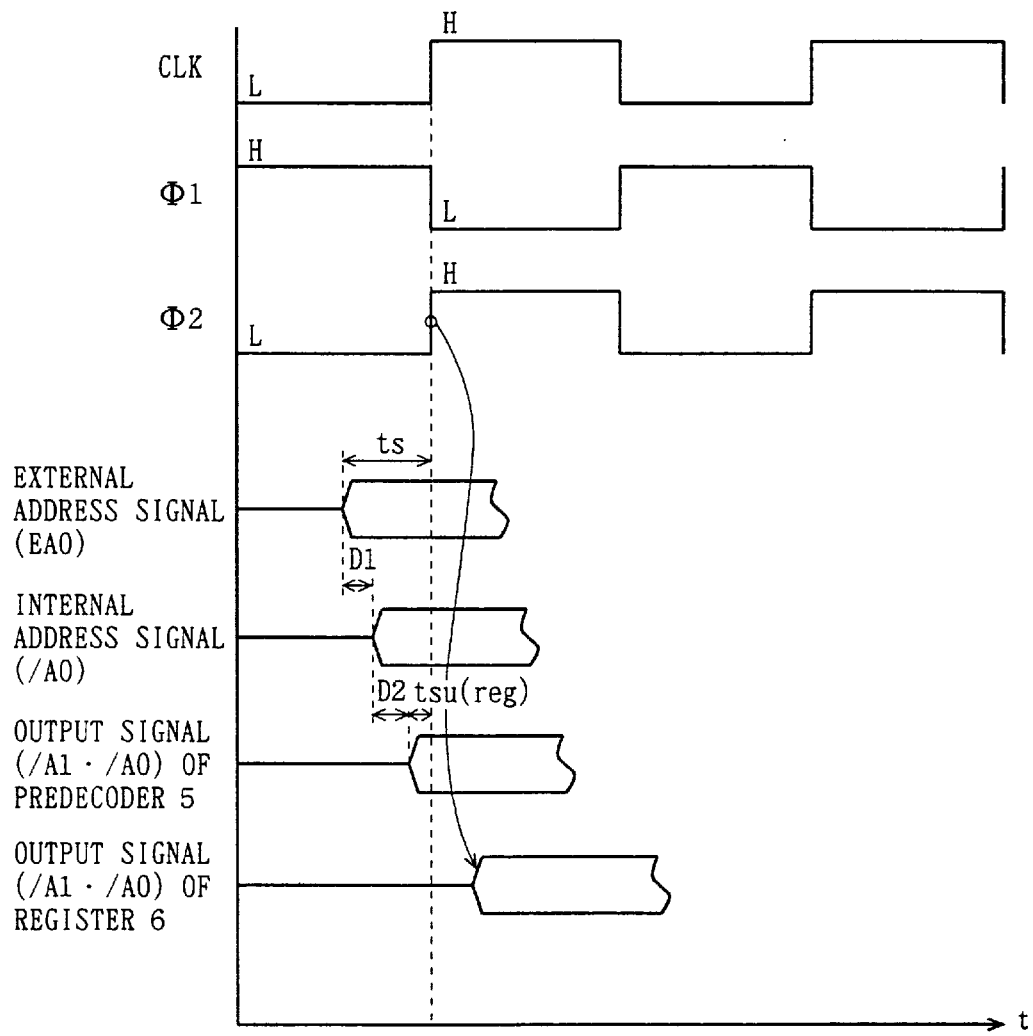
FIG. 9 is a timing chart showing an operation of the BSRAM of FIG. 8.

In the present first embodiment, the address input register 6 of FIG. 8 is divided into former stage address input register 6A that is located between address buffer 4 and predecoder 5, and latter stage address input register 6B.

The operation of BSRAM 10 of the above structure will be described hereinafter. When the set up time ts for external address signals EA0 and EA1 is long enough, i.e., when external address signals EA0 and EA1 are input long before the rise of internal clock signal φ2, predecode signals /A1•/A0, /A1•A0, A1•/A0, A1•A0 will be generated prior to the rise of internal clock signal φ2 as in the conventional case. Therefore, latch circuits 65–68 can reliably latch predecode signals /A1•/A0, /A1•A0, A1•/A0, A1•A0.

Figure 5:
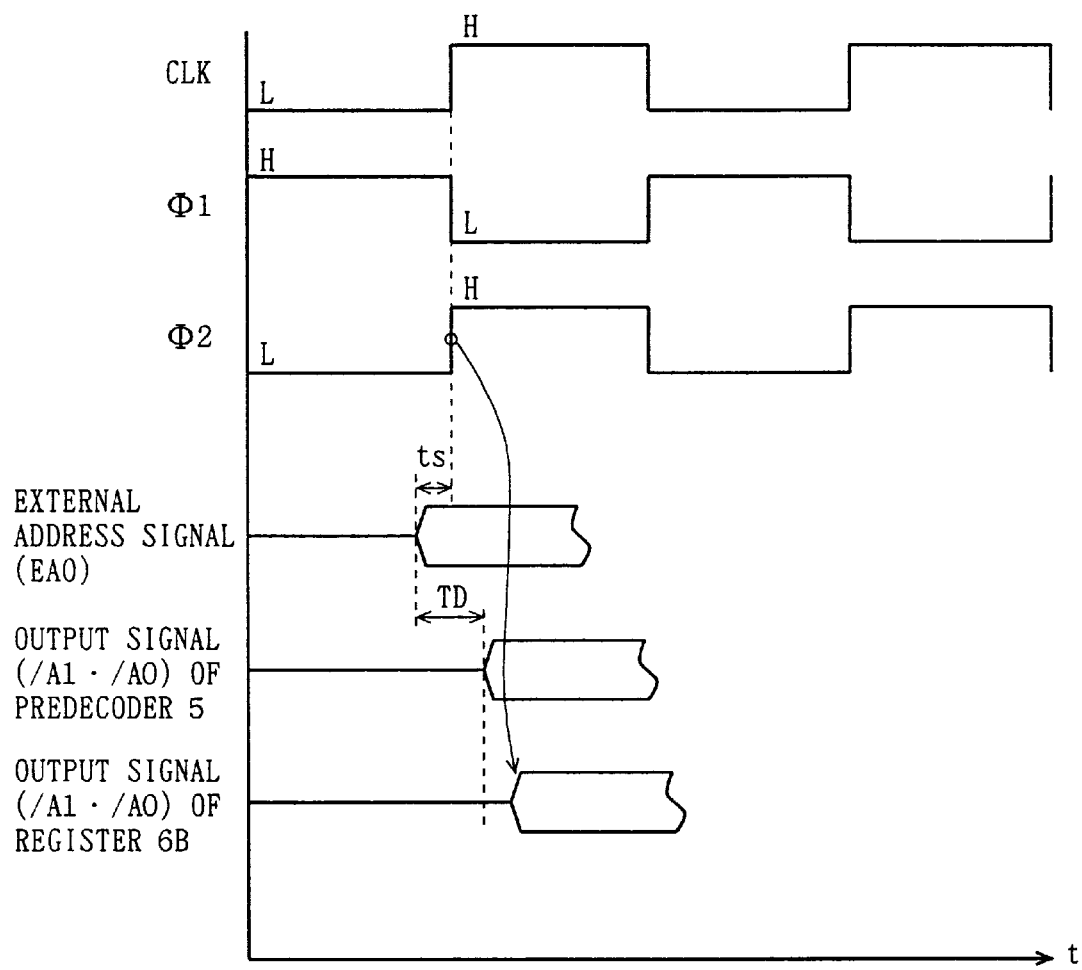
FIG. 5 is a timing chart showing an operation of the BSRAM of FIG. 1.

FIG. 5 is a timing chart showing the operation when set up time ts of the external address signal is short. When set up time ts of external address signals EA0 and EA1 is short, i.e., when external address signals EA0 and EA1 are applied slightly before the rise of internal clock signal φ2, there is a case where the generation of predecode signals /A1•/A0, /A1•A0, A1•/A0, A1•A0 is not in time for the rise of internal clock signal φ2. Assuming that the delay time by address buffer 4 is D1, the delay time by former stage address input register 6A is LD, and the delay time by predecoder 5 is D2, the total delay time TD from the input of external address signals EA0 and EA1 up to the generation of predecode signals /A1•/A0, /A1•A0, A1•/A0, A1•A0 is D1+LD+D2. Thus, generation of the predecode signal is delayed by time LD than the conventional case. However, predecode signals /A1•/A0, /A1•A0, A1•/A0, A1•A0 are directly applied to latch circuits 65–68 since latch circuits 61–64 are provided as preceding stages to predecoder 5. Although predecode signals /A1•/A0, /A1•A0, A1•/A0, A1•A0 are generated later than the rise of internal clock signal φ2, the generated predecode signals /A1•/A0, /A1•A0, A1•/A0, A1•A0 are latched by latch circuits 65–68 since internal clock signal φ2 at the current stage is at an H level. Therefore, latter stage address input register 6B can apply the proper predecode signals /A1•/A0, /A1•A0, A1•/A0, A1•A0 to decoder 7.

Similarly, even if the generation of spare element enable signal SEE by defective address program circuit 14 is later than the rise of internal clock signal φ2, latch circuit 18 can latch spare element enable signal SEE which is applied to redundancy decoder 71.

According to the first embodiment of the present invention, set up time ts of external address signals EA0 and EA1 can be reduced by providing predecoder 5 between latch circuits 61–64 and latch circuits 65–68. Also, the provision of defective address program circuit 14 between latch circuits 61–64 and latch circuit 18 provides the advantage of reducing set up time ts of external address signals EA0 and EA1 even when a redundancy circuit is used.

Second Embodiment

Figure 6:
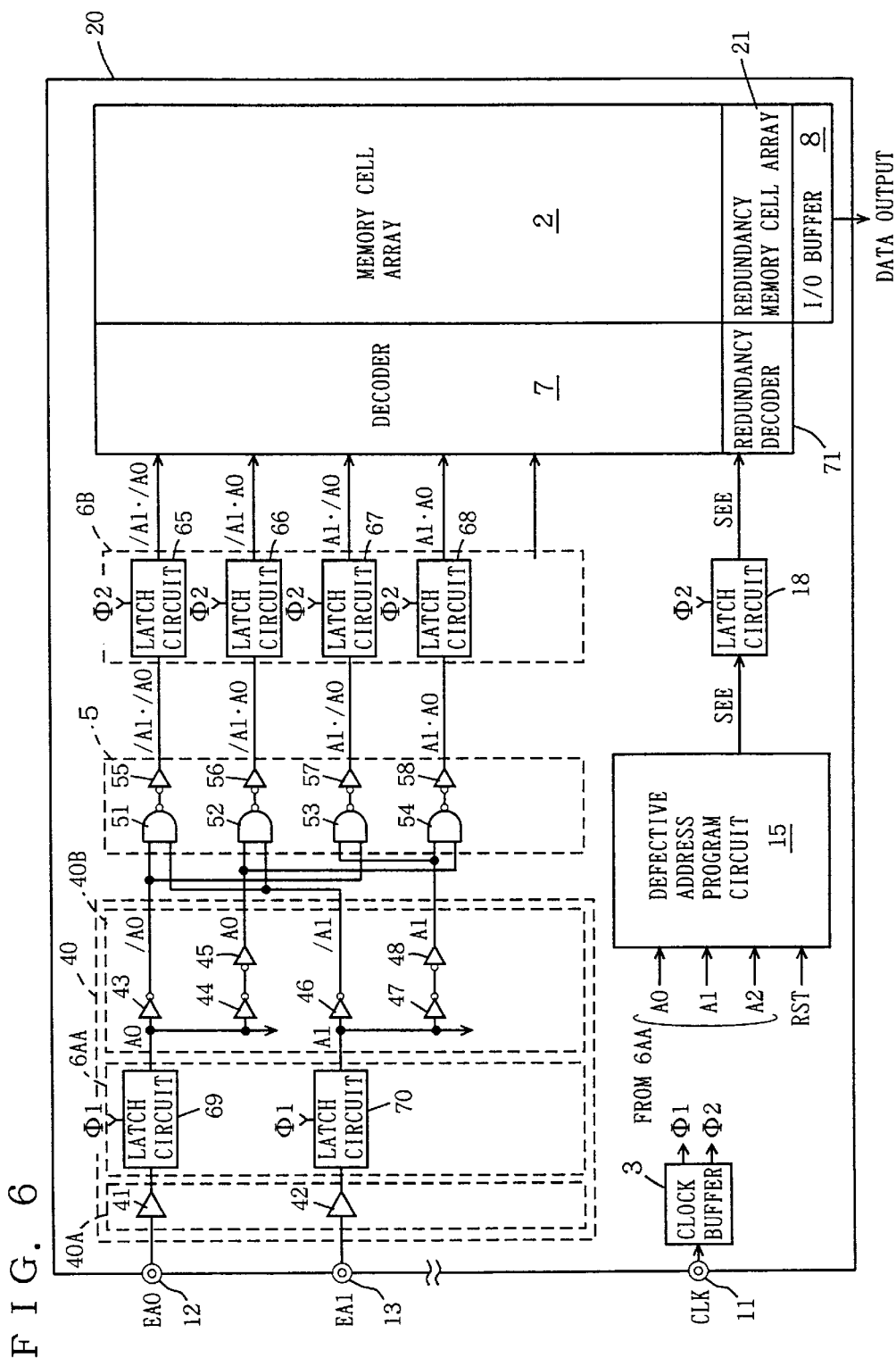
FIG. 6 is a block diagram showing a schematic structure of a BSRAM according to a second embodiment of the present invention.

FIG. 6 is block diagram showing a schematic structure of a BSRAM according to a second embodiment of the present invention. In contrast to the first embodiment shown in FIG. 1, a BSRAM 20 according to a second embodiment of the present invention has a former stage address input register 6AA provided within address buffer 40. More specifically, former stage address input register 6AA is provided between a former stage address buffer 40A including buffers 41 and 42, and a latter stage address buffer 40B including inverter circuits 43–48. In the second embodiment, internal address signals A0, A1, A2 from former stage address input register 6AA are applied to defective address program circuit 15.

Figure 7:
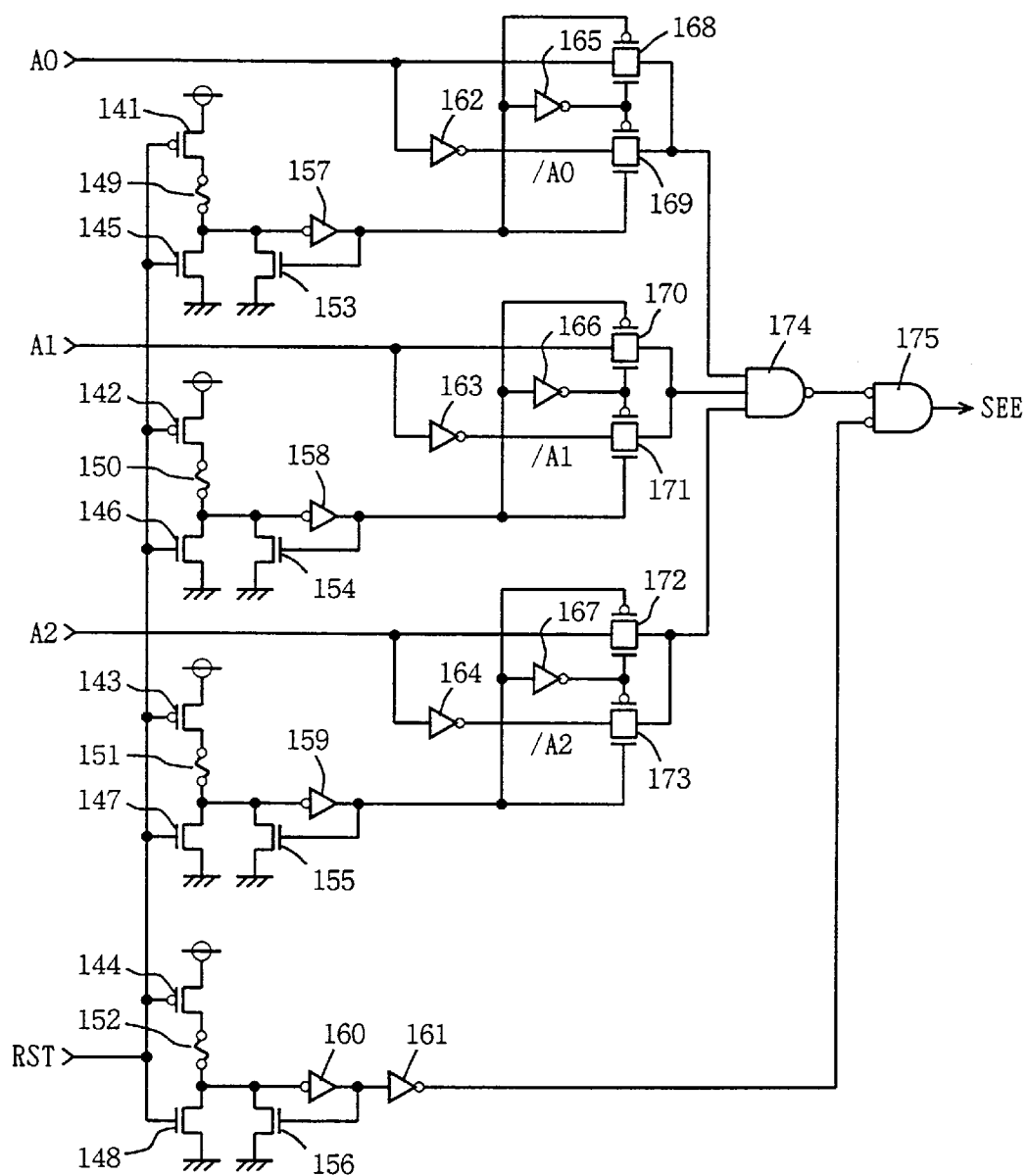
FIG. 7 is a circuit diagram showing a structure of the defective address program circuit of FIG. 6.

Therefore, defective address program circuit 15 includes a plurality of inverter circuits 162–164 as shown in FIG. 7, in addition to the structure of defective address program circuit 14 of FIG. 4. Inverter circuits 162–164 are provided corresponding to address signal bits A0, A1, A2. Inverter circuits 162–164 respond to address signals A0, A1, A2 to generate complementary address signals /A0, /A1, /A2.

According to the second embodiment of the present invention, the number of latch circuits 69 and 70 forming former stage address input register 6AA can be reduced than those in the first embodiment since former stage address input register 6AA is provided within address buffer 40. Therefore, the layout area required for former stage address input register 6AA can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with an external clock signal, comprising:

a memory cell array;

a redundant memory cell array;

a clock buffer generating first and second internal clock signals complementary to each other in response to said external clock signal;

a first latch circuit latching an address signal in response to said first internal clock signal;

a predecoder generating a predecode signal in response to the address signal from said first latch circuit;

a second latch circuit latching the predecode signal from said predecoder in response to said second internal clock signal;

a decoder accessing said memory cell array in response to the predecode signal from said second latch circuit;

a program circuit programmable of a defective address and generating an enable signal when the address signal from said first latch circuit designates the programmed defective address;

a third latch circuit latching said enable signal in response to said second internal clock signal; and a redundancy decoder accessing said redundant memory cell array in response to the enable signal from said third latch circuit.

2. The synchronous semiconductor memory device according to claim 1, further comprising an address buffer responsive to an external address signal to generate and apply to said first latch circuit first and second internal address signals complementary to each other.

3. The synchronous semiconductor memory device according to claim 1, further comprising:

a first address buffer responsive to an external address signal to generate and supply to said first latch circuit an internal address signal; and a second address buffer responsive to the internal address signal from said first latch circuit to generate and apply to said predecoder first and second internal address signals complementary to each other.

4. The synchronous semiconductor memory device according to claim 1, wherein said first latch circuit comprises a first switch turned on in response to said first internal clock signal, and a first latch latching an address signal applied through said first switch.

5. The synchronous semiconductor memory device according to claim 1, wherein said second latch circuit comprises a first switch turned on in response to said second internal clock signal, and a first latch latching an address signal applied through said first switch.

6. A synchronous semiconductor memory device operating in synchronization with an external clock signal, comprising:

a memory cell array;

a redundant memory cell array;

a clock buffer generating first and second internal clock signals complementary to each other in response to said external clock signal;

an address buffer including
(a) a plurality of buffers corresponding to bits of an external address signal, each buffer receiving a corresponding bit of said external address signal, and
(b) a complementary address generation circuit responsive to said external address signal from said plurality of buffers to generate first and second internal address signals complementary to each other;

a plurality of first latch circuits corresponding to bits of said first and second internal address signals, each first latch circuit latching a corresponding bit of said first and second internal address signals in response to said first internal clock signal;

a predecoder generating a predecode signal in response to the first and second internal address signals from said plurality of first latch circuits;

a plurality of second latch circuits corresponding to bits of said predecode signal, each second latch circuit latching a corresponding bit of the predecode signal from said predecoder in response to said second internal clock signal;

a decoder accessing said memory cell array in response to the predecode signal from said plurality of second latch circuits;

a program circuit programmable of a defective address and generating an enable signal when the first and second internal address signals from said plurality of first latch circuits designates the programmed defective address;

a third latch circuit latching said enable signal in response to said second internal clock signal; and a redundancy decoder accessing said redundant memory cell array in response to the enable signal from said third latch circuit.

7. A synchronous semiconductor memory device operating in synchronization with an external clock signal, comprising:

a memory cell array;

a redundant memory cell array;

a clock buffer generating first and second internal clock signals complementary to each other in response to said external clock signal;

an address buffer including
(a) a plurality of buffers corresponding to bits of an external address signal, each buffer receiving a corresponding bit of said external address signal,
(b) a plurality of first latch circuits corresponding to said plurality of buffers, each first latch circuit latching a bit of the external address signal from a corresponding buffer in response to said first internal clock signal, and
(c) a complementary address generation circuit generating first and second internal address signals complementary to each other in response to the external address signal from said plurality of first latch circuits;

a predecoder generating a predecode signal in response to the first and second internal address signals from said address buffer;

a plurality of second latch circuits corresponding to bits of said predecode signal, each second latch circuit latching a corresponding bit of the predecode signal from said predecoder in response to said second internal clock signal;

a decoder accessing said memory cell array in response to the predecode signal from said plurality of second latch circuits;

a program circuit programmable of a defective address and generating an enable signal when the external address signal from said plurality of first latch circuits designates the programmed defective address;

a third latch circuit latching said enable signal in response to said second internal clock signal; and a redundancy decoder accessing said redundant memory cell array in response to the enable signal from said third latch circuit.

* * * * *